United States Patent
Chan et al.

(10) Patent No.: US 7,528,076 B2
(45) Date of Patent: May 5, 2009

(54) METHOD FOR MANUFACTURING GATE OXIDE LAYER WITH DIFFERENT THICKNESSES

(75) Inventors: Shu-Chun Chan, Hsinchu (TW); Jung-Ching Chen, Hsinchu (TW); Shyan-Yhu Wang, Hsinchu County (TW)

(73) Assignee: United Microelectronics Corp., Hsinchu (TW)

( * ) Notice: Subject to any disclaimer, the term of this patent is extended or adjusted under 35 U.S.C. 154(b) by 201 days.

(21) Appl. No.: 11/747,822

(22) Filed: May 11, 2007

(65) Prior Publication Data

US 2008/0280448 A1 Nov. 13, 2008

(51) Int. Cl.
H01L 21/461 (2006.01)
H01L 21/302 (2006.01)

(52) U.S. Cl. ........................ 438/738; 438/756; 438/743; 438/750; 438/689; 438/695; 438/704; 438/718; 438/740; 438/751; 257/E21.219; 257/E21.227; 257/E21.229; 257/E21.625; 257/E21.628

(58) Field of Classification Search .......... 257/E21.219, 257/E21.227, E21.229, E21.625, E21.628
See application file for complete search history.

(56) References Cited

U.S. PATENT DOCUMENTS

| | | | | |
|---|---|---|---|---|
| 5,789,275 A | * | 8/1998 | Lee et al. ........................ 438/40 |
| 5,851,890 A | * | 12/1998 | Tsai et al. ..................... 438/303 |
| 6,037,201 A | * | 3/2000 | Tsai et al. ..................... 438/197 |
| 6,063,670 A | * | 5/2000 | Lin et al. ..................... 438/275 |
| 6,238,980 B1 | * | 5/2001 | Ueno .......................... 438/268 |
| 6,265,325 B1 | * | 7/2001 | Cao et al. ..................... 438/763 |
| 6,420,241 B2 | | 7/2002 | Jang et al. |
| 6,884,679 B2 | * | 4/2005 | Park et al. ..................... 438/257 |
| 7,049,245 B2 | | 5/2006 | Yeh et al. |
| 2003/0181027 A1 | | 9/2003 | Liang et al. |
| 2004/0018684 A1 | * | 1/2004 | Ji ............................... 438/258 |
| 2004/0092133 A1 | * | 5/2004 | Hyun et al. .................. 438/787 |
| 2006/0211190 A1 | * | 9/2006 | Chen et al. ................... 438/221 |
| 2007/0004144 A1 | * | 1/2007 | Park ........................... 438/258 |
| 2008/0142871 A1 | * | 6/2008 | Anezaki ..................... 257/321 |

* cited by examiner

*Primary Examiner*—Walter L Lindsay, Jr.
*Assistant Examiner*—Mohsen Ahmadi
(74) *Attorney, Agent, or Firm*—J.C. Patents (57) ABSTRACT

A method of manufacturing gate oxide layers with different thicknesses is disclosed. The method includes that a substrate is provided first. The substrate has a high voltage device region and a low voltage device region. Then, a high voltage gate oxide layer is formed on the substrate. Afterwards, a first wet etching process is performed to remove a portion of the high voltage gate oxide layer in the low voltage device region. Then, a second wet etching process is performed to remove the remaining high voltage gate oxide layer in the low voltage device region. The etching rate of the second wet etching process is smaller than that of the first wet etching process. Next, a low voltage gate oxide layer is formed on the substrate in the low voltage device region.

20 Claims, 6 Drawing Sheets

METHOD FOR MANUFACTURING GATE OXIDE LAYER WITH DIFFERENT THICKNESSES

BACKGROUND OF THE INVENTION

1. Field of the Invention

The present invention relates to a method of manufacturing an integrated circuit, and more particularly, to a manufacturing method of gate oxide layers with different thicknesses.

2. Description of Related Art

With the thriving of the electronics industry in recent years, the integrated circuit chip has been widely used. In order to meet the cutting-edge demand from the electronics industry, many techniques regarding the manufacturing of the semiconductor develop rapidly as well.

In integrated circuit devices, different circuits need different circuit devices with different basic operational characteristics to coordinate closely with. In order to meet the demands for competitive edges and diversity of the circuit device, certain circuits need to be equipped with devices having gate oxide layers with different thicknesses at the same time to meet the requirements of different operational voltages. Hence, the need for multiple gate oxide layer thicknesses arises. Generally, devices of different voltages, such as high voltage (HV) devices and low voltage (LV) devices, exist simultaneously on the same chip. A high voltage device requires a thicker gate oxide layer to withstand the high voltage operation environment, whereas a thinner gate oxide layer in a low voltage device can well withstand the low voltage operation environment.

In view of the current manufacturing process, when the thicknesses of gate oxide layers vary greatly, some difficulties would emerge in the subsequent manufacturing process. Therefore, how to manufacture gate oxide layers having different thicknesses and maintain the quality of the layers so that the efficiency of devices is not affected has become a primary issue that urgently needs solving.

SUMMARY OF THE INVENTION

In view of the aforementioned, the present invention provides a method of manufacturing gate oxide layers with different thicknesses. The manufacturing method can solve the conventional problem caused by great difference in thicknesses among gate oxide layers and thereby improve the quality of the gate oxide layers.

The invention provides a manufacturing method of gate oxide layers with different thicknesses. The method includes that a substrate is provided first. The substrate has a first device region and a second device region. Then, a first gate oxide layer is formed on the substrate. Afterwards, a first wet etching process is performed to remove a portion of the first gate oxide layer in the second device region. Next, a second wet etching process is performed to remove the remaining first gate oxide layer in the second device region. The etching rate of the second wet etching process is smaller than that of the first wet etching process. Then, a second gate oxide layer is formed on the substrate of the second device region. The thickness of the second gate oxide layer is smaller than that of the first gate oxide layer.

According to the description of the embodiments of the invention, the substrate further includes a third device region. In one embodiment, the manufacturing method further includes that when performing the first wet etching process to remove a portion of the first gate oxide layer in the second device region, a portion of the first gate oxide layer in the third device region is removed simultaneously. Afterwards, when performing the second wet etching process to remove the remaining first gate oxide layer in the second device region, the remaining first gate oxide layer in the third device region is removed simultaneously. Then, a third gate oxide layer is formed on the substrate in the third device region. The thickness of the third gate oxide layer is between the thicknesses of the first gate oxide layer and the second gate oxide layer. The method of forming the third gate oxide layer is, for example, a thermal oxidation process, a chemical vapor deposition (CVD) process or other suitable methods. According to the aforementioned, the first device region, the second device region and the third device region are device regions used for different voltage operations.

According to the embodiments of the invention, the first wet etching process may use a buffered oxide etchant (BOE), and the second wet etching process may use a diluted hydrofluoric acid. The buffered oxide etchant is a solution of $HF/NH_4F$ in a ratio of 20:1 mixed with water. The diluted hydrofluoric acid is a solution of $HF/H_2O$ in a ratio of 1:10.

According to the embodiments of the invention, the substrate between the first device region and the second device region has a device isolation structure. The device isolation structure is, for example, a shallow trench isolation structure or a field oxide layer.

According to the embodiments of the invention, the method of forming the first gate oxide layer is, for example, a thermal oxidation process or a chemical vapor deposition (CVD) process.

According to the embodiments of the invention, the method of forming the second gate oxide layer is, for example, a thermal oxidation process or a chemical vapor deposition (CVD) process.

The invention further provides a manufacturing method of gate oxide layers with different thicknesses. The method includes that a substrate is provided first. The substrate has a high voltage device region and a low voltage device region. Then, a high voltage gate oxide layer is formed on the substrate. Afterwards, a first wet etching process is performed to remove a portion of the high voltage gate oxide layer in the low voltage device region. Afterwards, a second wet etching process is performed to remove the remaining high voltage gate oxide layer in the low voltage device region. The etching rate of the second wet etching process is smaller than that of the first wet etching process. Then, a low voltage gate oxide layer is formed on the substrate in the low voltage device region.

According to the embodiments of the invention, the first wet etching process may use a buffered oxide etchant (BOE), and the second wet etching process may use a diluted hydrofluoric acid. The buffered oxide etchant is a solution of $HF/NH_4F$ in a ratio of 20:1 mixed with water. The diluted hydrofluoric acid is a solution of $HF/H_2O$ mixed with water in the ratio of 1:10.

According to the embodiments of the invention, the substrate between the first device region and the second device region has a device isolation structure. The device isolation structure is, for example, a shallow trench isolation structure or a field oxide layer.

According to the embodiments of the invention, the method of forming the first gate oxide layer is, for example, a thermal oxidation process or a chemical vapor deposition (CVD) process.

According to the embodiments of the invention, the method of forming the second gate oxide layer is, for example, a thermal oxidation process or a chemical vapor deposition (CVD) process.

The manufacturing method of the invention includes that a wet etching process of a high etching speed is performed to remove a portion of the high voltage gate oxide layer in the low voltage device region. Then, a wet etching process of a low etching speed is performed to remove the remaining high voltage gate oxide layer. Therefore, the method of the invention would not result in the problem of roughness or unevenness in the side wall profile of the high voltage gate oxide layer because of over-etching. Furthermore, the method can improve the problem of surface damage of the substrate in the low voltage device region and forms gate oxide layers of good quality. Besides, the method of the invention can also avoid creating depressions in the area where the device isolation structure and the substrate adjoin, thereby causing problems such as the kink effect and the thinning of gate oxide layers.

In order to make the aforementioned and other objects, features and advantages of the present invention more comprehensible, preferred embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Reference will now be made in detail to the present preferred embodiments of the invention, examples of which are illustrated in the accompanying drawings. Wherever possible, the same reference numbers are used in the drawings and the description to refer to the same or like parts.

FIGS. 1A to 1D are schematic diagrams illustrating a manufacturing method of gate oxide layers with different thicknesses according to one embodiment of the invention.

Figure 1A:
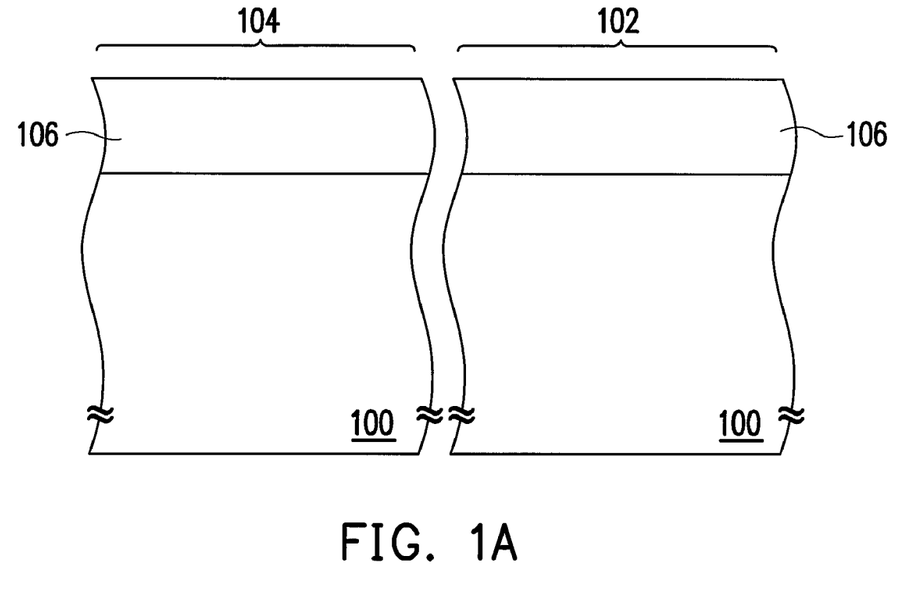
FIGS. 1A to 1D are schematic diagrams illustrating a manufacturing method of gate oxide layers with different thicknesses according to one embodiment of the invention.

Referring to FIG. 1A, first, a substrate 100 is provided. The substrate 100 has a high voltage device region 102 and a low voltage device region 104. In the present embodiment, the high voltage device region 102 is a device region under the voltage operation of 40 volts, for example. The low voltage device region 104 is a device region under the voltage operation of 3.3 volts for example.

Still referring to FIG. 1A, afterwards, a high voltage gate oxide layer 106 is formed on the substrate 100. The material of the high voltage gate oxide layer 106 is, for example, silicon oxide, and the method of forming the same may include performing a thermal oxidation process, a chemical vapor deposition (CVD) process or other suitable methods. The thickness of the high voltage gate oxide layer 106 is around 850 angstroms.

Figure 1B:
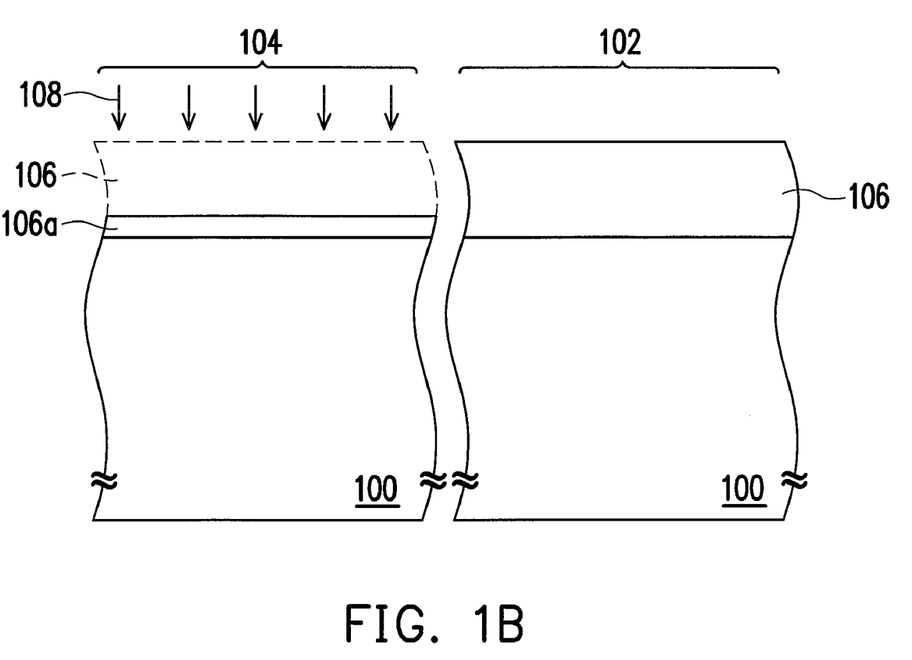

Next, wet etching processes with different etching speeds are used to remove the high voltage gate oxide layer in the low voltage device region. Referring to FIG. 1B, the first wet etching process 108 is performed to remove a portion of the high voltage gate oxide layer 106 in the low voltage device region 104 and leave the high voltage gate oxide layer 106a. The thickness of the un-removed high voltage gate oxide layer 106a is between 100 and 150 angstroms. In the present embodiment, the first wet etching process 108 may use a buffered oxide etchant (BOE), which is a solution of $HF/NH_4F$ in a volume ratio of 20:1 mixed with water. The etching speed of the BOE is around 400 to 450 angstroms per minute.

Figure 1C:
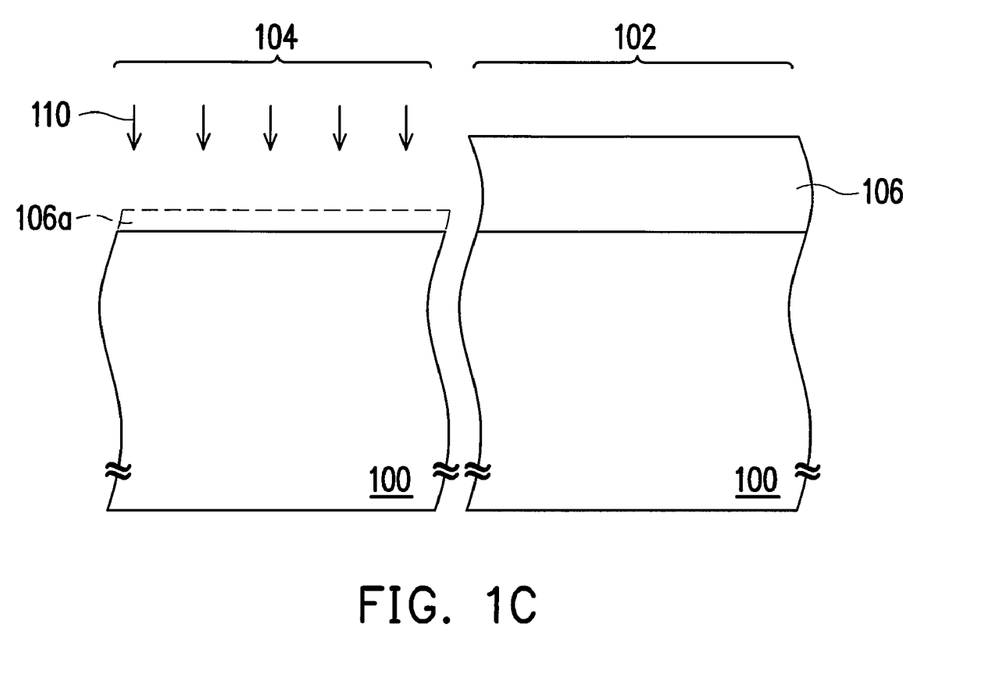

Afterwards, referring to FIG. 1C, a second wet etching process 110 is performed to remove the remaining high voltage gate oxide layer 106a in the low voltage device region 104. In the present embodiment, the second wet etching process 110 may use a diluted HF (DHF), which is a solution of $HF/H_2O$ in a volume ratio of 1:10. The etching speed of the DHF is around 50 to 70 angstroms per minute.

It is noted that in the conventional manufacturing method, an etchant with a high etching speed is used to directly remove the high voltage gate oxide layer in the low voltage device region until the substrate surface is exposed so that the time is shortened and the production cost is reduced. However, the method is likely to over-etch in order to make sure the high voltage gate oxide layer in the low voltage device region is completely removed. As a result, the problem of roughness or unevenness in the side wall profile of the high voltage gate oxide layer in the high voltage device region emerges and the substrate surface of the low voltage device region is damaged. All of the foregoing problems affect the subsequent manufacturing process and result in bad quality of the subsequently formed gate oxide layers and lower the efficiency of devices.

Additionally, the conventional method of removing the high voltage gate oxide layer in the low voltage device region further includes performing a dry etching process. The method requires photomasks and thus the production cost is raised and the plasma used by the method also cause damage to the substrate surface.

Figure 1D:
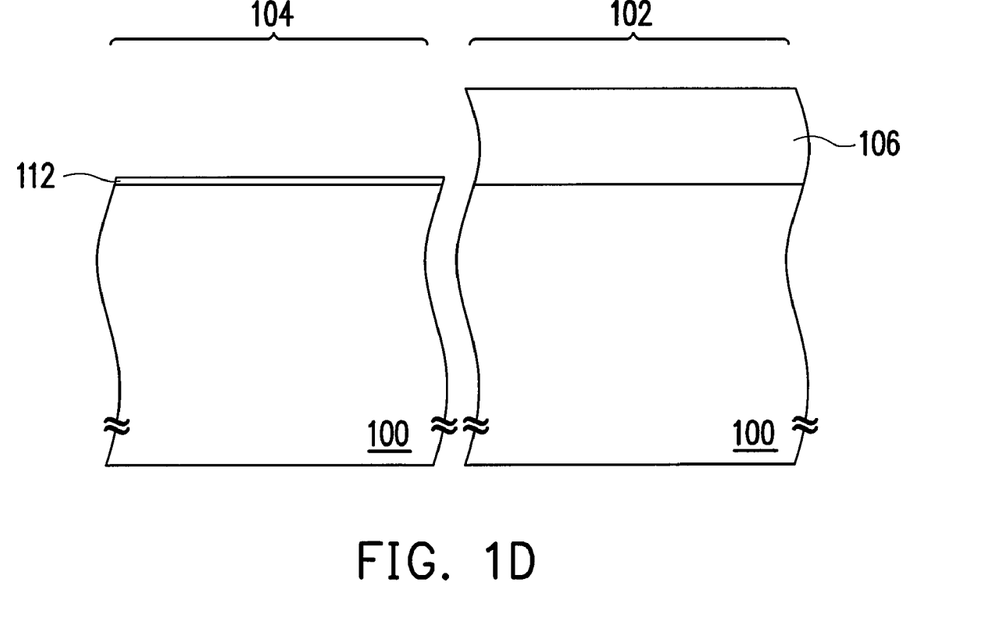

Next, referring to FIG. 1D, after the high voltage gate oxide layer 106 of the low voltage device region 104 is removed, a low voltage gate oxide layer 112 is formed on the substrate 100 of the low voltage device region 104. The material of the low voltage gate oxide layer 112 is, for example, silicon oxide, and the method of forming the same may include performing a thermal oxidation process, a chemical vapor deposition (CVD) process or other suitable methods. The thickness of the low voltage gate oxide layer 112 is around 65 angstroms.

In one embodiment, the substrate 100 further includes a middle voltage device region (not shown) under the voltage operation between 40 volts and 3.3 volts. According to the aforementioned, the method of forming a middle voltage gate oxide layer in the middle voltage device region may include that when performing a first wet etching process 108, a portion of the high voltage gate oxide layer in the middle voltage device region is simultaneously removed. Next, when performing a second wet etching process 110, the remaining high voltage gate oxide layer in the middle voltage device region is simultaneously removed. Then, a middle voltage gate oxide layer is formed on the substrate 100 in the middle voltage device region. The thickness of the middle voltage gate oxide layer is between the thicknesses of the high voltage gate oxide layer and the low voltage gate oxide layer, i.e. between 65 and 850 angstroms.

It is noted that a wet etching process of a high etching speed is first performed to remove a portion of the high voltage gate oxide layer in the low voltage device region, and then a wet etching process of a low etching speed is performed to remove the remaining high voltage gate oxide layer. Therefore, the method of the invention would not result in the problem of roughness or unevenness in the side wall profile of the high voltage gate oxide layer because of over-etching. Furthermore, the method can mitigate the problem of surface damage to the substrate in the low voltage device region and form gate oxide layers of good quality. Moreover, the method of the present embodiment does not require additional photomasks and thereby reduce the production cost.

Other embodiments are described to illustrate the method of the invention more clearly in the following.

FIGS. 2A to 2D are schematic diagrams illustrating a manufacturing method of gate oxide layers with different thicknesses according to another embodiment of the invention. Field oxide layers are illustrated in the present embodiment as the device isolation structures. The descriptions of the same members in FIGS. 2A to 2D and FIGS. 1A to 1D are omitted herein.

Figure 2A:
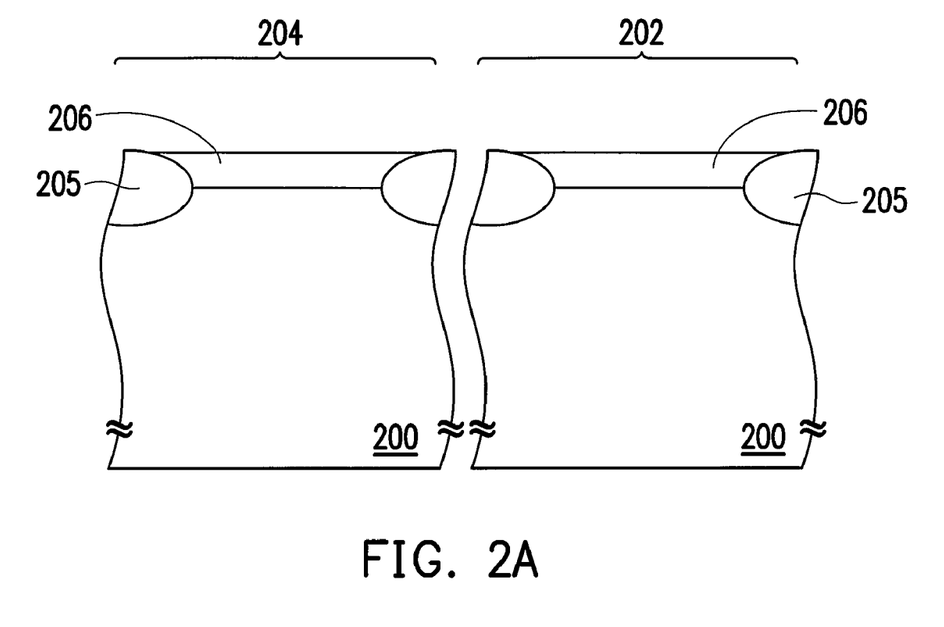
FIGS. 2A to 2D are schematic diagrams illustrating a manufacturing method of gate oxide layers with different thicknesses according to another embodiment of the invention.

Referring to FIG. 2A, first, a substrate 200 is provided. The substrate 200 has a high voltage device region 202 and a low voltage device region 204. Further, a field oxide layer 205 is disposed between a high voltage device region 202 and a low voltage device region 204 as a device isolation structure. Then, a high voltage gate oxide layer 206 is formed on the substrate 200.

Figure 2B:
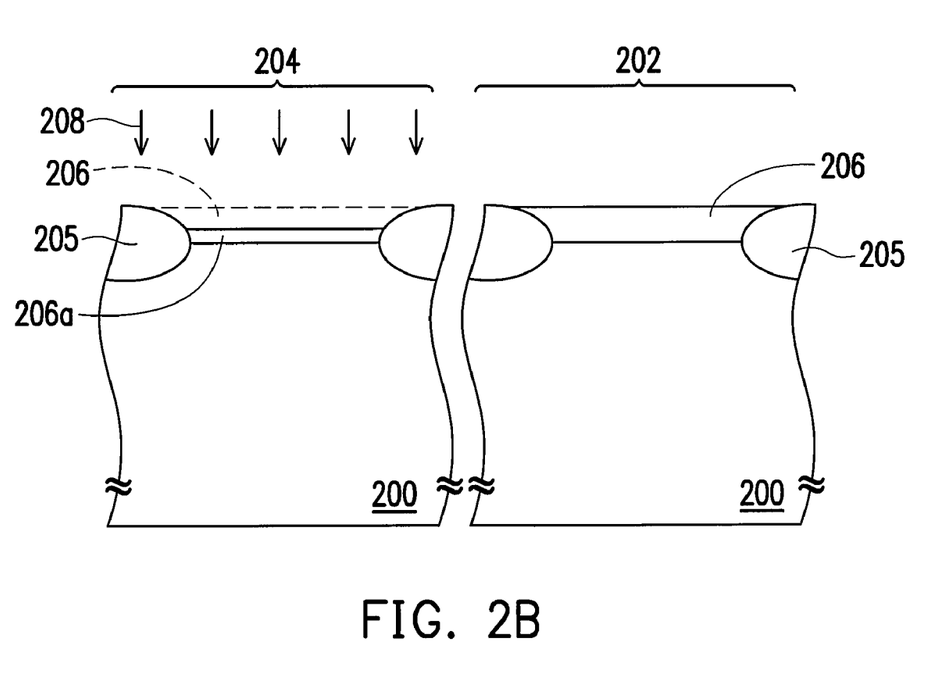

Referring to FIG. 2B, a first wet etching process 208 is performed to remove a portion of the high voltage gate oxide layer 206 in the low voltage device region 204 and leave a high voltage gate oxide layer 206a.

Figure 2C:
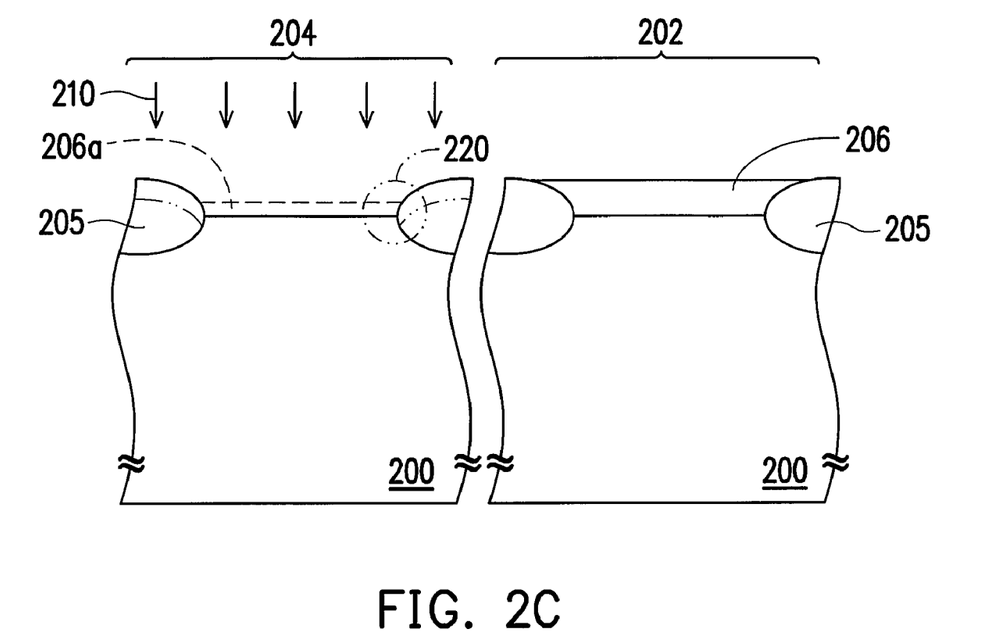

Afterwards, referring to FIG. 2C, a second wet etching process 210 is performed to remove the remaining high voltage gate oxide layer 206a in the low voltage device region 204.

It should be noted that the conventional method using an etchant of high etching speed to directly remove the high voltage gate oxide layer in the low voltage device region usually results in a portion of the field oxide layer being etched and forming depressions in the area where the substrate and the field oxide layer adjoin (as shown in numeral 220 of FIG. 2C). The depressions would cause the kink effect and affect the efficiency of devices.

In addition, when gate oxide layers are formed subsequently, because the depressions in the adjacent area between the field oxide layers and the substrate would affect the oxidation speed, the thickness of the gate oxide layer formed in the adjacent area of the field oxide layer and the substrate is thinner than the thickness of the gate oxide layer formed on the substrate. There is the problem of uneven thickness, which is the so-called gate oxide layer thinning and results in the electric problem of devices affecting the efficiency of devices.

Figure 2D:
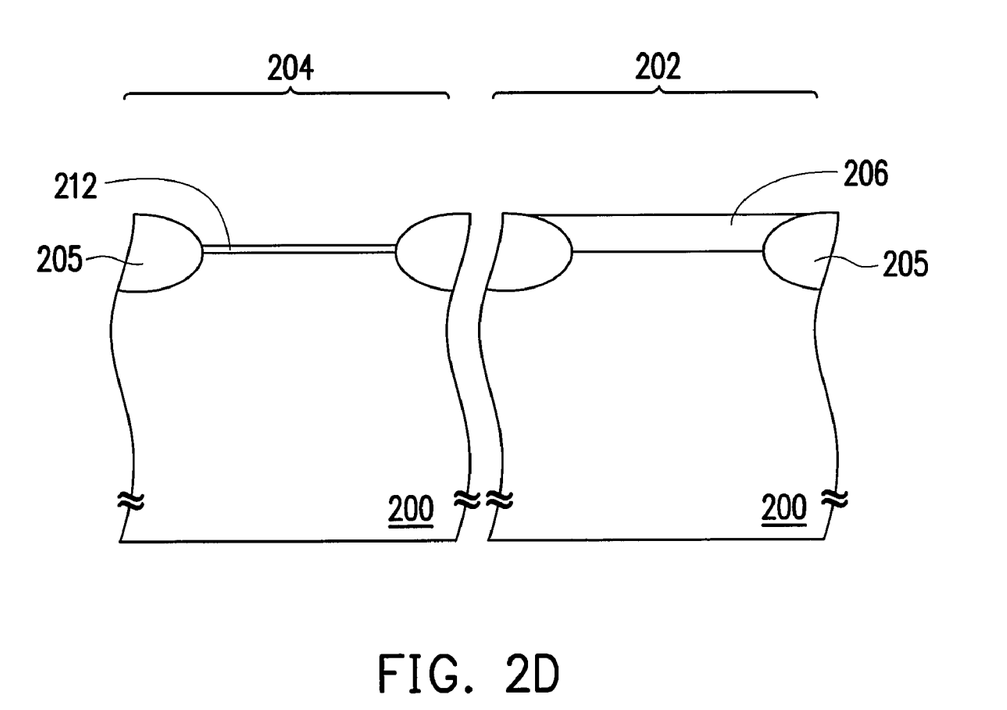

Next, referring to FIG. 2D, after the high voltage gate oxide layer 206 in the low voltage device region 204 is removed, a low voltage gate oxide layer 212 is formed on the substrate 200 in the low voltage device region 204.

The manufacturing method of the present embodiment includes that a wet etching process of a high etching speed is performed to remove a portion of the high voltage gate oxide layer in the low voltage device region. Then, a wet etching process of a low etching speed is further performed to remove the remaining high voltage gate oxide layer. Hence, depressions do not get formed in the adjacent area between the substrate and the field oxide layer because of over-etching and thus the problems of the kink effect and the gate oxide layer thinning can be prevented from happening and thereby raising the efficiency of devices.

FIGS. 3A to 3D are schematic diagrams illustrating a manufacturing method of gate oxide layers with different thicknesses according to another embodiment of the invention. Shallow trench isolation structures are illustrated in the present embodiment as the device isolation structures. The descriptions of the same members in FIGS. 3A to 3D and FIGS. 1A to 1D are omitted herein.

Figure 3A:
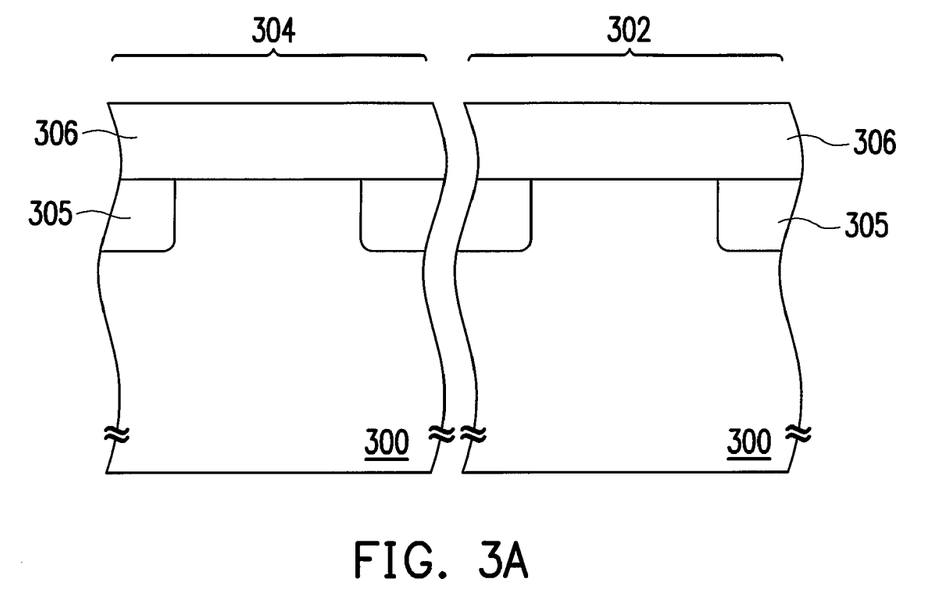
FIGS. 3A to 3D are schematic diagrams illustrating a manufacturing method of gate oxide layers with different thicknesses according to yet another embodiment of the invention.

Referring to FIG. 3A, first, a substrate 300 is provided. The substrate 300 has a high voltage device region 302 and a low voltage device region 304. Further, a shallow trench isolation structure 305 is disposed between the high voltage device region 302 and the low voltage device region 304 as a device isolation structure. Then, a high voltage gate oxide layer 306 is formed on the substrate 300.

Figure 3B:
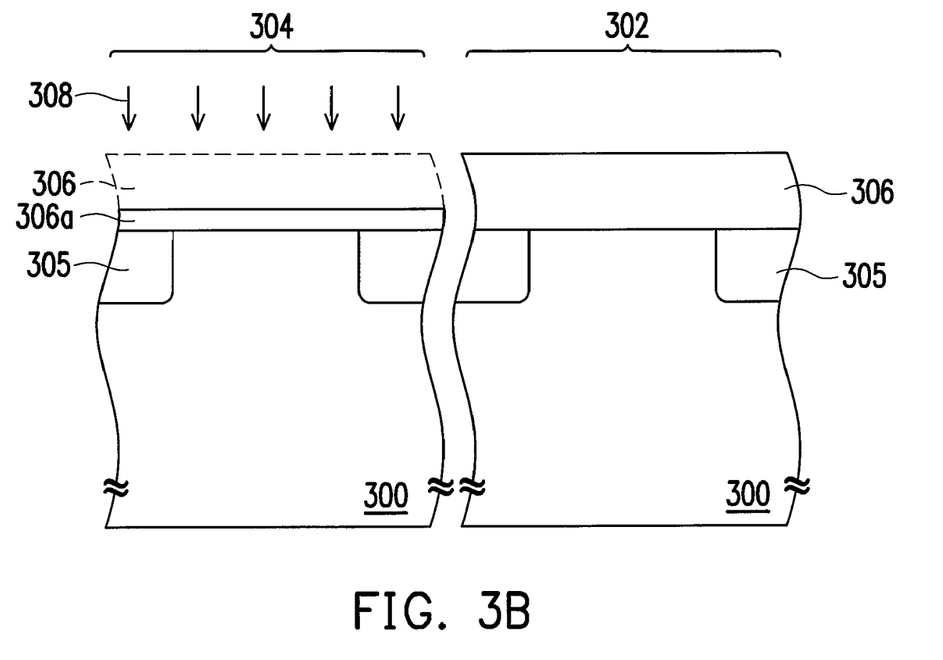

Referring to FIG. 3B, then, a first wet etching process 308 is performed to remove a portion of the high voltage gate oxide layer 306 in the low voltage device region 304 and leave the high voltage gate oxide layer 306a.

Figure 3C:
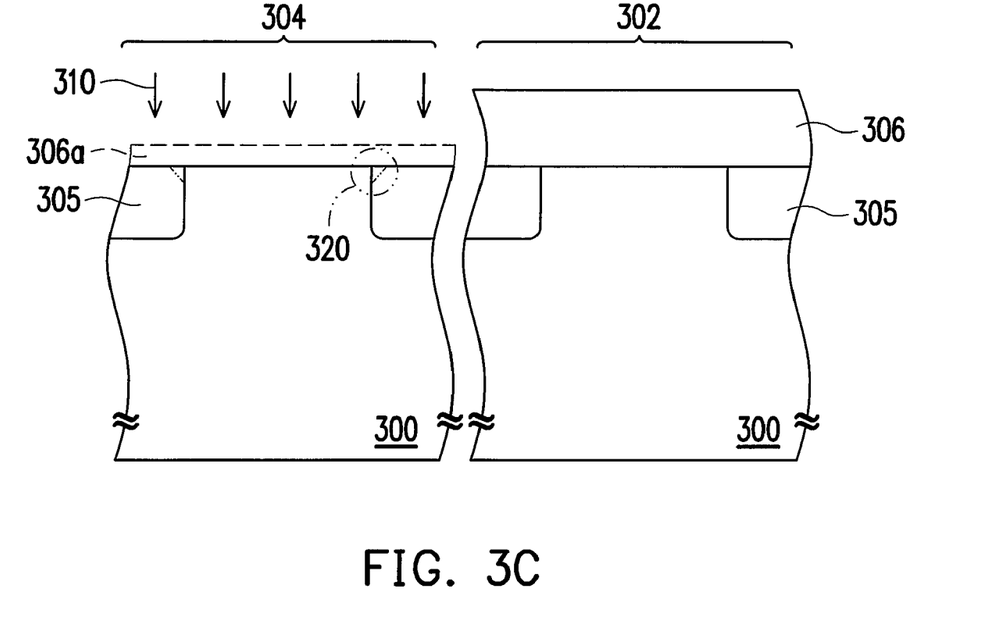

Afterwards, referring to FIG. 3C, a second wet etching process 310 is performed to remove the remaining high voltage gate oxide layer 306a in the low voltage device region 304.

It should be noted that the conventional method using an etchant of a high etching speed to directly remove the high voltage gate oxide layer in the low voltage device region also results in a portion of the shallow trench isolation structure being etched and forming depressions at the top edge corner (as shown by the numeral 320 of FIG. 3C). The depressions would cause the kink effect and affect the efficiency of devices. Further, when gate oxide layers are formed subsequently, the depressions would result in the so-called gate oxide layer thinning, affect the electric problem of devices and lower the efficiency of devices.

Figure 3D:
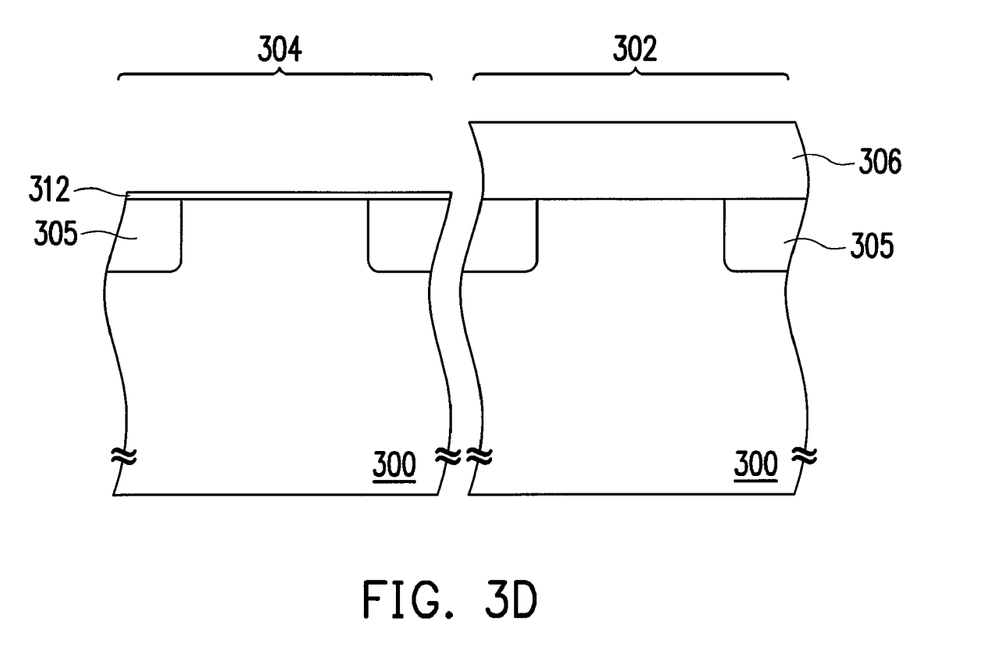

Next, referring to FIG. 3D, after the high voltage gate oxide layer 306 in the low voltage device region 304 is removed, a low voltage gate oxide layer 312 is formed on the substrate 300 in the low voltage device region 304.

Since the method of the present embodiment includes performing wet etching processes of different etching speeds to remove the high voltage gate oxide layer in the low voltage device region, depressions do not get formed at the top edge corner of the shallow trench isolation structures and thus the problems of the kink effect and the gate oxide layer thinning can be prevented from happening and thereby raising the efficiency of devices.

In summary, the present invention includes at least the following advantages:

1. The manufacturing method of the present invention avoids the conventional problem of roughness or unevenness in the side wall profile of gate oxide layers and mitigates the problem of surface damage on the substrate in the low voltage device region. Furthermore, the method also raises the quality of gate oxide layers formed subsequently.

2. The manufacturing method of the invention does not require additional photomasks as a dry etching process and thus saves the production cost.

3. The manufacturing method of the invention does not create depressions in the adjacent area between the device isolation structure and the substrate, and thereby the problems such as the kink effect and the gate oxide layer thinning do not happen.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of manufacturing gate oxide layers with different thicknesses, comprising:
   providing a substrate, the substrate comprising a first device region and a second device region;
   forming a first gate oxide layer on the substrate;
   performing a first wet etching process to remove a portion of the first gate oxide layer in the second device region;
   performing a second wet etching process to remove the remaining first gate oxide layer in the second device region, wherein the etching rate of the second wet etching process is smaller than that of the first etching process; and
   forming a second gate oxide layer on the substrate in the second device region, wherein the thickness of the second gate oxide layer is smaller than that of the first gate oxide layer.

2. The method of manufacturing gate oxide layers with different thicknesses of claim 1, wherein the substrate further comprises a third device region.

3. The method of manufacturing gate oxide layers with different thicknesses of claim 2, further comprising:
   when performing the first wet etching process to remove a portion of the first gate oxide layer in the second device region, a portion of the first gate oxide layer in the third device region being removed simultaneously;
   when performing the second wet etching process to remove the remaining first gate oxide layer in the second device region, the remaining first gate oxide layer in the third device region being removed simultaneously; and
   forming a third gate oxide layer on the substrate in the third device region, wherein the thickness of the third gate oxide layer is between that of the first gate oxide layer and the second gate oxide layer.

4. The method of manufacturing gate oxide layers with different thicknesses of claim 3, wherein the method of forming the third gate oxide layer comprises a thermal oxidation process or a chemical vapor deposition (CVD) process.

5. The method of manufacturing gate oxide layers with different thicknesses of claim 2, wherein the first device region, the second device region and the third device region are device regions used in different voltage operations.

6. The method of manufacturing gate oxide layers with different thicknesses of claim 1, wherein the first wet etching process comprises using a buffered oxide etchant (BOE) and the second wet etching process comprises using a diluted HF (DHF).

7. The method of manufacturing gate oxide layers with different thicknesses of claim 6, wherein the buffered oxide etchant (BOE) is a solution of $HF/NH_4F$ in a ratio of 20:1 mixed with water.

8. The method of manufacturing gate oxide layers with different thicknesses of claim 6, wherein the diluted HF (DHF) is a solution of $HF/H_2O$ in a ratio of 1:10.

9. The method of manufacturing gate oxide layers with different thicknesses of claim 1, wherein the substrate between the first device region and the second device region has a device isolation structure.

10. The method of manufacturing gate oxide layers with different thicknesses of claim 9, wherein the device isolation structure comprises a shallow trench structure or a field oxide layer.

11. The method of manufacturing gate oxide layers with different thicknesses of claim 1, wherein the method of forming the first gate oxide layer comprises a thermal oxidation process or a chemical vapor deposition (CVD) process.

12. The method of manufacturing gate oxide layers with different thicknesses of claim 1, wherein the method of forming the second gate oxide layer comprises a thermal oxidation process or a chemical vapor deposition (CVD) process.

13. A method of manufacturing gate oxide layers with different thicknesses, comprising:
   providing a substrate, the substrate having a high voltage device region and a low voltage device region;
   forming a high voltage gate oxide layer on the substrate;
   performing a first wet etching process to remove a portion of the high voltage gate oxide layer in the low voltage device region;
   performing a second wet etching process to remove the remaining high voltage gate oxide layer in the low voltage device region,
   wherein the etching rate of the second wet etching process is smaller than that of the first wet etching process; and
   forming a low voltage gate oxide layer on the substrate in the low voltage device region.

14. The method of manufacturing gate oxide layers with different thicknesses of claim 13, wherein the first wet etching process comprises using a buffered oxide etchant (BOE) and the second wet etching process comprises using a diluted HF (DHF).

15. The method of manufacturing gate oxide layers with different thicknesses of claim 14, wherein the buffered oxide etchant is a solution of $HF/NH_4F$ in a ratio of 20:1 mixed with water.

16. The method of manufacturing gate oxide layers with different thicknesses of claim 14, wherein the diluted HF (DHF) is a solution of $HF/H_2O$ in a ratio of 1:10.

17. The method of manufacturing gate oxide layers with different thicknesses of claim 13, wherein the substrate between the high voltage device region and the low voltage device region has a device isolation structure.

18. The method of manufacturing gate oxide layers with different thicknesses of claim 17, wherein the device isolation structure comprises a shallow trench structure or a field oxide layer.

19. The method of manufacturing gate oxide layers with different thicknesses of claim 13, wherein the method of forming the high voltage gate oxide layer comprises a thermal oxidation process or a chemical vapor deposition (CVD) process.

20. The method of manufacturing gate oxide layers with different thicknesses of claim 13, wherein the method of forming the low voltage gate oxide layer comprises a thermal oxidation process or a chemical vapor deposition (CVD) process.

* * * * *